United States Patent
Lin et al.

(10) Patent No.: US 10,989,034 B2
(45) Date of Patent: *Apr. 27, 2021

(54) TIME-DEPENDENT SPATIAL DISTRIBUTION OF PROPPANT EFFECTS IN A DISCRETE FRACTURE NETWORK

(71) Applicant: Halliburton Energy Services, Inc., Houston, TX (US)

(72) Inventors: Avi Lin, Houston, TX (US); Srinath Madasu, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/096,145

(22) PCT Filed: Jul. 29, 2016

(86) PCT No.: PCT/US2016/044890
§ 371 (c)(1),
(2) Date: Oct. 24, 2018

(87) PCT Pub. No.: WO2018/022115
PCT Pub. Date: Feb. 1, 2018

(65) Prior Publication Data
US 2019/0145238 A1    May 16, 2019

(51) Int. Cl.
*E21B 43/267* (2006.01)
*E21B 41/00* (2006.01)
(Continued)

(52) U.S. Cl.
CPC ........... *E21B 43/267* (2013.01); *E21B 41/00* (2013.01); *G06F 9/455* (2013.01); *G06F 17/11* (2013.01); *G06F 30/23* (2020.01)

(58) Field of Classification Search
CPC ......... E21B 43/267; G06F 9/455; G06F 17/11
See application file for complete search history.

(56) References Cited

U.S. PATENT DOCUMENTS 9,026,416 B2 * 5/2015 Mallison ................. E21B 43/00
703/10
2011/0320177 A1  12/2011 Bowen et al.
(Continued)

FOREIGN PATENT DOCUMENTS

WO  2013016733 A1  1/2013
WO  2013119345 A1  8/2013
(Continued)

OTHER PUBLICATIONS

Wu, H., et al., "A Computational Model for Simulating Proppant Transport in Wellbore and Fractures for Unconventional Treatments," SPE-171739-MS, Abu Dhabi International Petroleum Exhibition and Conference, Nov. 10-13, 2014, 11 pages.

*Primary Examiner* — Silvana C Runyan
(74) *Attorney, Agent, or Firm* — John W. Wustenberg; Parker Justiss, P.C.

(57) ABSTRACT

A hydraulic fracturing flow simulation method includes identifying a discrete fracture network that partitions a reservoir into porous rock blocks. The method further includes determining a current network state that includes flow parameter values at discrete points arranged one-dimensionally along the fractures in said network. The method further includes constructing a set of linear equations for deriving a subsequent network state from the current state. The method further includes repeatedly solving the set of linear equations to obtain a sequence of subsequent network states, the sequence embodying a time-dependent spatial distribution of at least one flow parameter, said flow parameter comprising a proppant volume fraction. The method further includes displaying the time-dependent spatial distribution.

20 Claims, 4 Drawing Sheets

(51) Int. Cl.
*G06F 9/455* (2018.01)
*G06F 30/23* (2020.01)
*G06F 17/11* (2006.01)

(56) References Cited

U.S. PATENT DOCUMENTS

| | | |
|---|---|---|
| 2012/0158380 A1 | 6/2012 | Hajibeygi et al. |
| 2016/0053606 A1* | 2/2016 | Neuhaus ............... E21B 43/267 166/250.1 |
| 2016/0108705 A1* | 4/2016 | Maxwell ............... E21B 43/267 166/250.1 |
| 2017/0247998 A1* | 8/2017 | Shetty ................... E21B 43/267 |
| 2018/0306015 A1* | 10/2018 | Shetty .................. G01V 99/005 |

FOREIGN PATENT DOCUMENTS

| | | |
|---|---|---|
| WO | 2014193529 A2 | 12/2014 |
| WO | 2015030837 A1 | 3/2015 |
| WO | 2015117116 A1 | 8/2015 |
| WO | 2015117118 A1 | 8/2015 |
| WO | 2018022115 A1 | 2/2018 |

\* cited by examiner

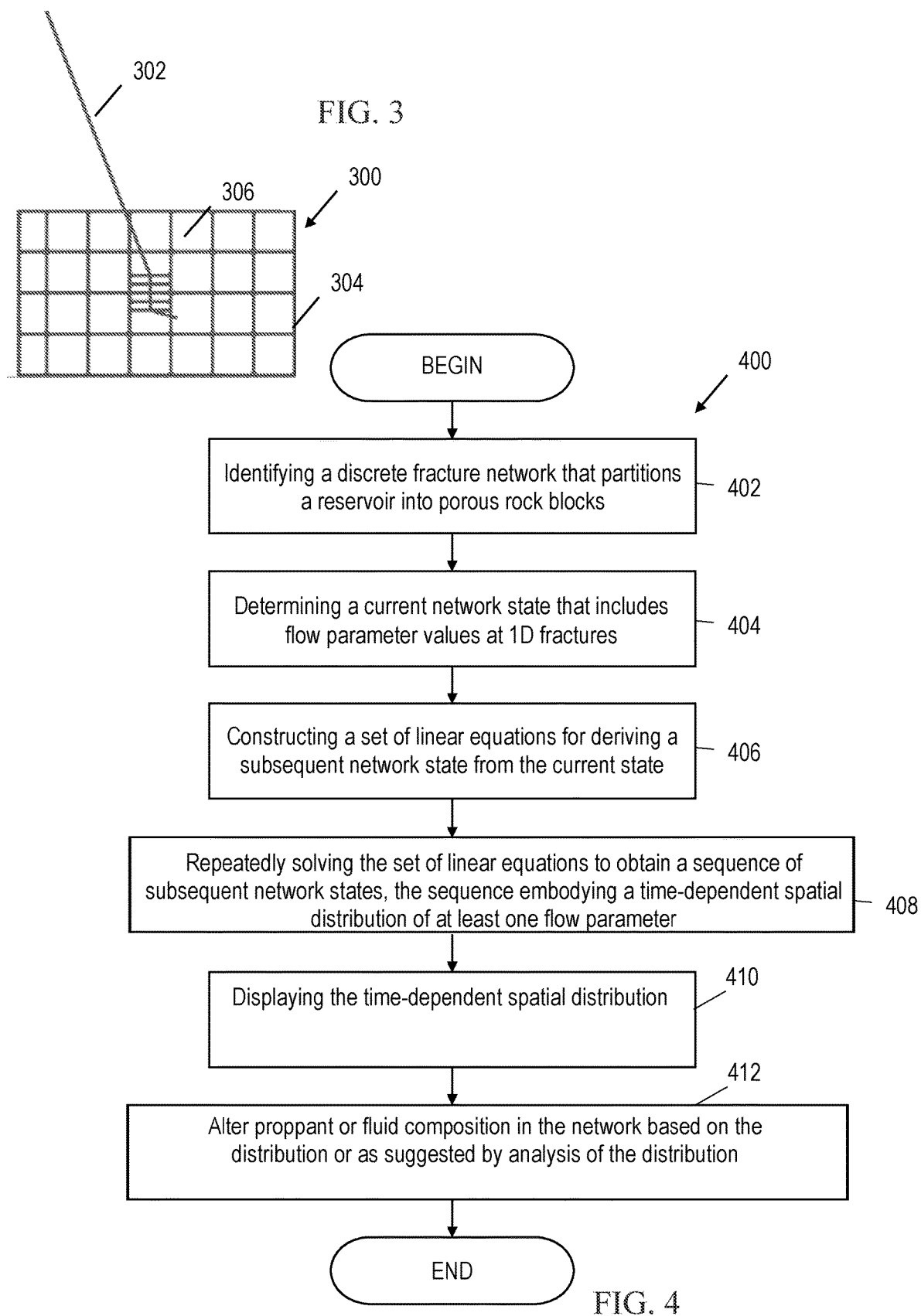

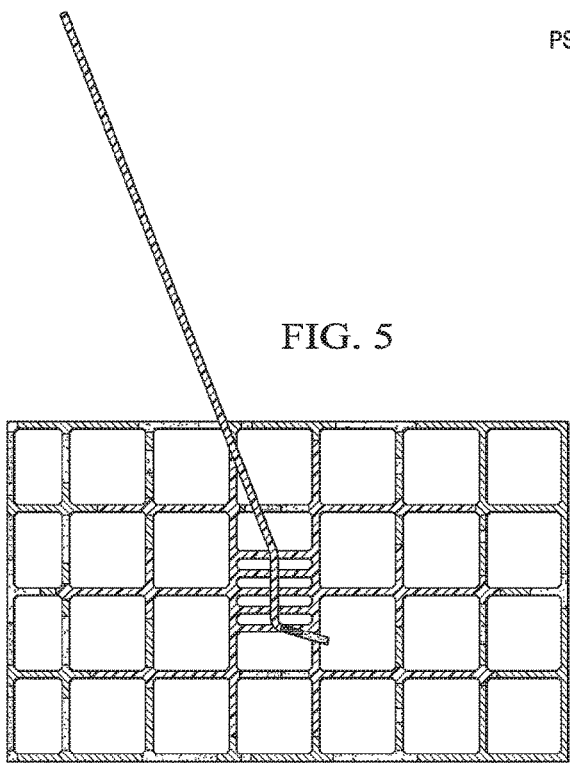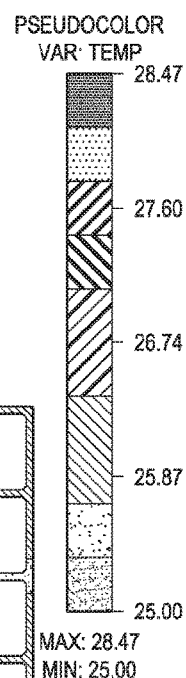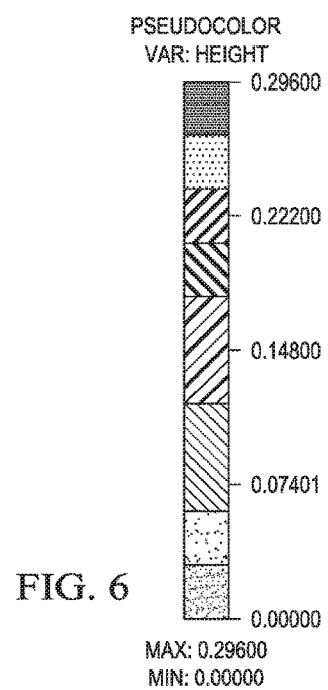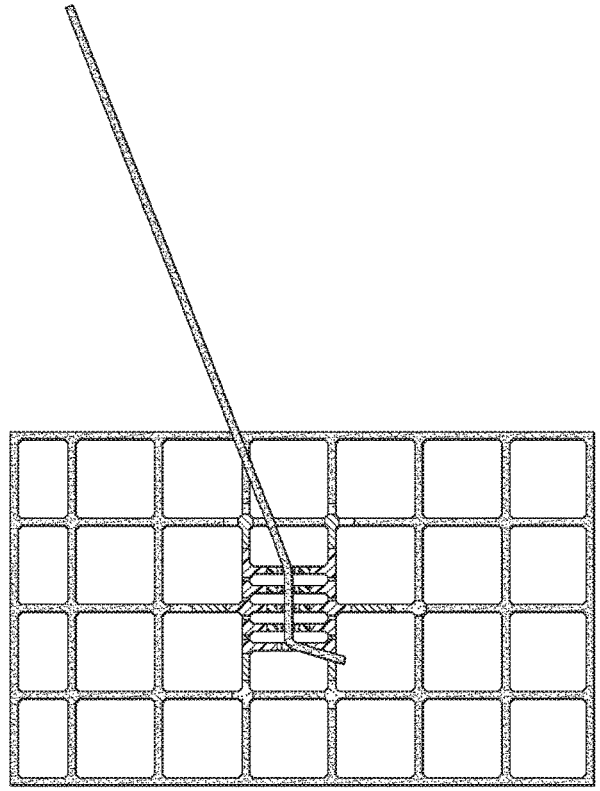
FIG. 5
FIG. 6

TIME-DEPENDENT SPATIAL DISTRIBUTION OF PROPPANT EFFECTS IN A DISCRETE FRACTURE NETWORK

CROSS-REFERENCE TO RELATED APPLICATION

This application is the National Stage of, and therefore claims the benefit of, International Application No. PCT/US2016/044890 filed on Jul. 29, 2016, entitled "TIME-DEPENDENT SPATIAL DISTRIBUTION OF PROPPANT EFFECTS IN A DISCRETE FRACTURE NETWORK," which was published in English under International Publication Number WO 2018/022115 on Feb. 1, 2018. The above application is commonly assigned with this National Stage application and is incorporated herein by reference in its entirety.

BACKGROUND

In the oil and gas industry, unconventional reservoirs often have a low-permeability rock matrix that impedes fluid flow, making it difficult to extract hydrocarbons (or other fluids of interest) at commercially-feasible rates and volumes. Fortunately, the effective permeability of the formation can be increased by hydraulic fracturing. When the rock matrix is exposed to a high-pressure high-volume flow of a relatively incompressible fluid, the low permeability causes sharp gradients in the formation's stress field, forcing integrity failures at the relatively weakest points of the rock matrix. Such failures often occur as a sudden "cracking" or fracturing of the matrix that momentarily reduces the stress gradient until it can be rebuilt by the intruding fluid flow. As the high-pressure flow continues, the fractures may propagate, for example, as an intermittent series of small cracks or branches. The injected fluid also deforms and shifts blocks of matrix material, complicating the fracture propagation analysis. Adding yet another complication, small grains of sand or other proppants may be added to the flow with the goal of keeping the fractures open after the fluid pressure is removed. Additionally, these proppants may be of multiple types or sizes that alter fluid flow in particular ways only when used in conjunction with certain other proppant types or sizes.

Accordingly, accurate simulation of the hydraulic fracturing operation requires that proppant and proppant fluid phenomena be taken into account. However, the computational resources available for simulation are typically limited, making it a challenge to maximize the efficiency of the simulation process within these constraints while ensuring that the accuracy is sufficient to guide field operations.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

BRIEF DESCRIPTION OF THE DRAWINGS

Accordingly, to optimize these tradeoffs, systems and methods using a time-dependent spatial distribution of proppant effects in a network of fractures are disclosed herein. In the following detailed description of the various disclosed embodiments, reference will be made to the accompanying drawings in which:

FIG. 3 is a diagram of an illustrative discrete fracture network;

FIG. 4 is a flow diagram of an illustrative fracturing simulation method; and

FIGS. 5-7 are diagrams embodying illustrative predicted time-dependent spatial distributions.

Figure 1:
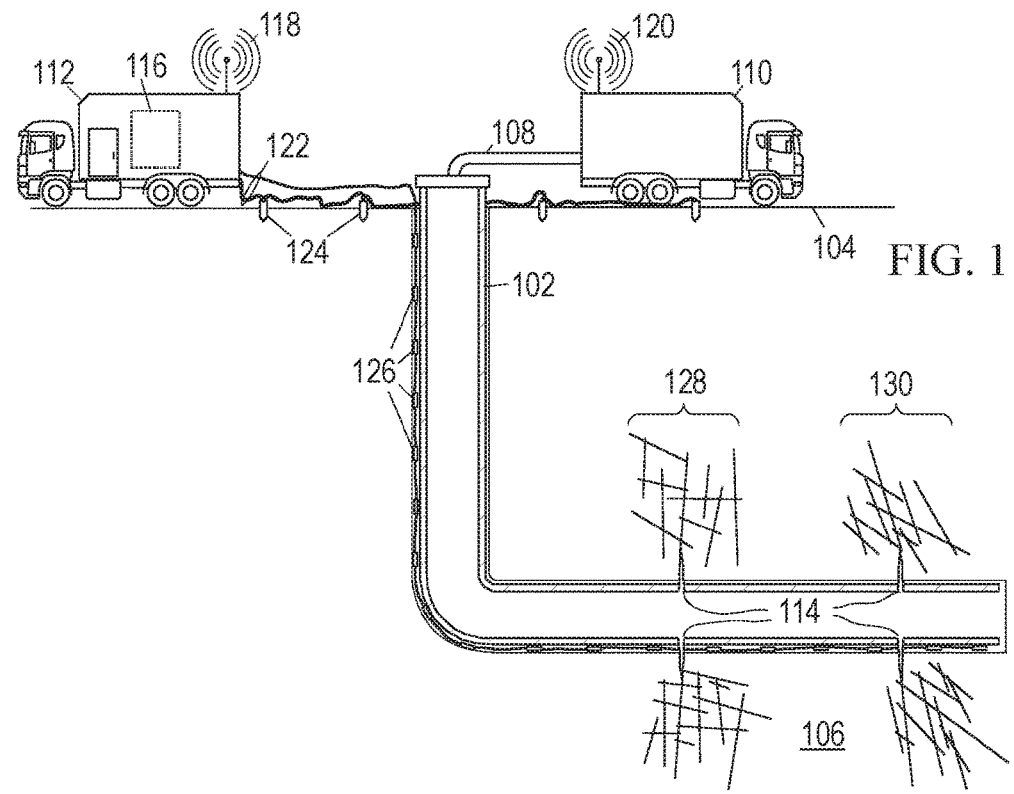
FIG. 1 is a contextual view of an illustrative fracturing environment.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

The issues identified in the background are at least partly addressed by systems and methods using a time-dependent spatial distribution of proppant effects. Specifically, describing how proppants behave inside fractures allow for generation of the time-dependent spatial distribution. Analysis of the distribution, including predictions about the distribution, leads to real-time modification of the fracturing job to optimize production.

The disclosed systems and methods are best understood in terms of the context in which they are employed. As such, FIG. 1 shows the environment of an illustrative hydraulic fracturing operation. A wellbore 102 extends from the surface 104 into a subterranean region 106. Typically, the subterranean region 106 includes a reservoir that contains hydrocarbons or other resources such as, e.g., shale, coal, sandstone, granite, or other rocks with pores containing oil or natural gas. The subterranean region 106 may include naturally fractured rock or natural rock formations that are not fractured to any significant degree. When the subterranean region 106 includes tight gas formations (i.e., natural gas trapped in low permeability rock such as shale), it is typically desirable to create additional fractures in the formation to increase the formation's effective permeability.

Accordingly, FIG. 1 also shows an injection assembly coupled to supply a high-pressure, high-volume fluid flow via a conduit 108 to the wellbore 102. The injection assembly includes one or more pump trucks 110 and instrument trucks 112 that operate to inject fluid via the conduit 108 and the wellbore 102 into the subterranean region 106, thereby opening existing fractures and creating new fractures. The fluid reaches the formation via one or more fluid injection locations 114, which in many cases are perforations in the casing of wellbore 102. Such casing may be cemented to the wall of the wellbore 102, though this is not required. In some implementations, all or a portion of the wellbore 102 may be left open, i.e., without casing. The conduit 108 may include an injection manifold and feed pipe, as well as piping internal to the wellbore such as a work string, coiled tubing, sectioned pipe, or other type of conduit.

The fracture treatment may employ a single injection of fluid to one or more fluid injection locations 114, or it may employ multiple such injections, optionally with different fluids. Where multiple fluid injection locations 114 are employed, they can be stimulated concurrently or in stages. Moreover, they need not be located within the same wellbore 102, but may for example be distributed across multiple wells or multiple laterals within a well. A treatment control system 116 coordinates operation of the injection assembly components (pump trucks, feed tanks, throttles, valves, flow sensors, pressure sensors, etc.) to monitor and control the fracture treatment. Though shown as being local to a single instrument truck 112, the treatment control system 116 may in practice take the form of multiple data acquisition and processing systems optionally distributed throughout the injection assembly and wellbore 102, as well as remotely-coupled offsite computing facilities available via communication links and networks. Though the computing system is described below in FIG. 2 as a separate entity for implementing hydraulic fracture simulation, some contemplated embodiments of the treatment control system 116 have the simulator as an integrated component.

The treatment control system 116 may periodically or continuously obtain measurement data as a function of position and/or time. Among other things, the treatment control system 116 processes data and generates a representative display for a user or operator to perceive. Software may run on the treatment control system 116 to collect the data and organize it in a file or database stored on non-transient information storage media. Specifically, a processor coupled to memory may execute the software. The software may respond to user input via a keyboard or other input mechanism to display data as an image or movie on a monitor or other output mechanism. The software may process the data to optimize fracturing operations as described below. In at least one embodiment, the treatment control system 116, or a portion of the treatment control system 116, is located downhole within a housing able to protect the treatment control system 116 from the harsh downhole environment. In another embodiment, processors both at the surface and downhole may work together or independently to obtain, store, and process data. The treatment control system 116 may include computing hardware such as handheld mobile devices, tablets, notebooks, laptops, desktop computers, workstations, mainframes, distributed computing networks, and virtual (cloud) computing systems.

The treatment control system 116 may include data processing equipment, communication equipment, and other equipment for monitoring and controlling injection treatments applied to the subterranean region 106 through the wellbore 102. Additionally, the treatment control system 116 may be communicably linked to a remote computing facility that can calculate, select, or optimize treatment parameters for initiating, opening, extending, and conveying proppant into fractures. The treatment control system 116 may also receive, generate, or modify a fracture treatment plan (e.g., a pumping schedule) that specifies properties of a fracture treatment to be applied to the subterranean region 106. Based on simulated behavior, the treatment control system 116 shown in FIG. 1 controls operation of the injection assembly to optimize proppant types, proppant sizes, proppant effects, and the like.

The pump trucks 110 can include mobile vehicles, immobile installations, skids, hoses, tubes, fluid tanks, fluid reservoirs, pumps, valves, mixers, or other types of structures and equipment. They supply treatment fluid and other materials (e.g., proppants, cross linked gels, linear gels, surfactants, breakers, stop-loss materials, diverters) for the fracture treatment. The illustrated pump trucks 110 communicate treatment fluids into the wellbore 102 at or near the level of the ground surface 104. The pump trucks 110 are coupled to valves and pump controls for starting, monitoring, stopping, increasing, decreasing or otherwise controlling pumping as well as controls for selecting or otherwise controlling fluids pumped during the treatment.

The instrument trucks 112 can include mobile vehicles, immobile installations, or other suitable structures and sensors for measuring temperatures, pressures, flow rates, and other treatment, production, and flow parameters. The example instrument trucks 112 shown in FIG. 1 include a treatment control system 116 that controls or monitors the fracture treatment applied by the injection assembly. The injection assembly may inject fluid into the formation above, at, or below a fracture initiation pressure; above, at, or below a fracture closure pressure; or at another fluid pressure.

Communication links 118, 120 enable the instrument trucks 112 to communicate with the pump trucks 110 and other equipment at the ground surface 104. Additional communication links 122 enable the instrument trucks 112 to communicate with sensors or data collection apparatus in the wellbore 102, other wellbores, remote facilities, and other devices and equipment. The communication links can include wired or wireless communications assemblies, or a combination thereof. FIG. 1 shows communication links 122 for an array of surface seismic sensors 124 and an array of downhole seismic sensors 126 for detecting and locating microseismic events. Though downhole sensors 126 are shown as being positioned in the injection well, they can also or alternatively be located in one or more nearby monitoring wells. Sensors 124 and/or 126 detect seismic energy from the microseismic events that occur as fractures are formed and propagated. The received energy signals from the sensors are processed by the treatment control system 116 to determine the microseismic event locations, times, and magnitudes. Such information is indicative of the fracture locations and dimensions, which information may be used to determine when the fracturing operations should be terminated and how to carry out subsequent operations to achieve the desired results.

Specifically, FIG. 1 shows that a treatment has fractured the subterranean region 106, producing first and second fracture families 128, 130 from respective perforations 114. The induced fractures may extend through naturally fractured rock, regions of un-fractured rock, or both. The injected fracturing fluid can flow from the induced fractures into the natural fracture networks, into the rock matrix, or into other locations in the subterranean region 106 (e.g., faults, voids). The injected fracturing fluid can, in some instances, dilate or propagate the natural fractures or other pre-existing fractures in the rock formation. The formation and propagation of fractures produces microseismic events, which may be identified and located based on analysis of the signals from sensors 124 and 126. The progression of the fracturing operation can thus be monitored and such monitoring used to derive information useful for simulating the fracture networks that have been formed and which may be formed in future fracturing operations in the region.

In some implementations, the treatment control system 116 collects and analyzes the signals from sensors 124, 126 to map fractures, monitor the spatial distribution of injected fluids, and to control the fluid injection parameters to optimize the modification of effective formation permeability. For example, the treatment control system 116 can modify, update, or generate a fracture treatment plan (pumping rates, pressures, volumes, fluid compositions including proppant type and size, and timing) based on the estimated spatial distributions of various proppant effects determined by simulation as described with respect to FIG. 2.

Figure 2:
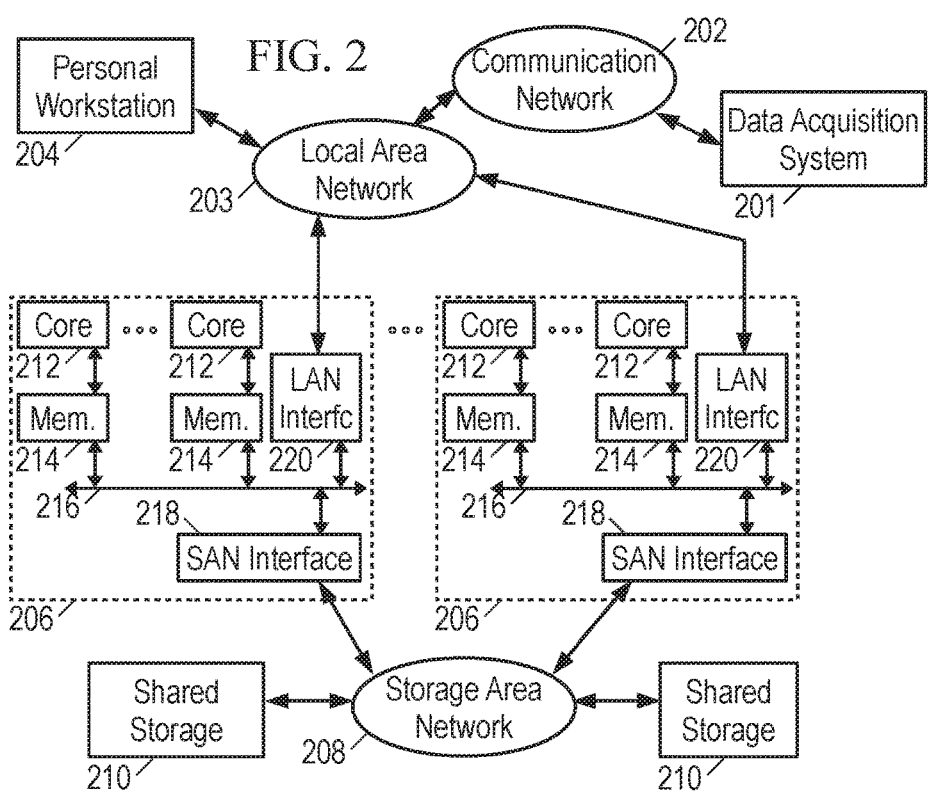
FIG. 2 is a block diagram of an illustrative system for fracturing simulation.

FIG. 2 shows an illustrative computing system 200 in which a data acquisition system 201 represents the instrument trucks 112 and other sources of data regarding the well and surrounding formations. The data acquisition module 201 may identify a discrete fracture network, including multiple types or sizes of proppants and multiple fluids, that partitions a reservoir into porous rock blocks. A communications network 202 (such as, e.g., the internet or other communications link for transferring digital data) couples the data acquisition system 201 to a local area network ("LAN") 203 to communicate the data to a personal workstation 204. The data can include treatment program data, geological data, fracture data, fluid data, and the like. Workstation 204 may take the form of a desktop computer having a user interface (e.g., keyboard, pointer, and display) that enables the user to interact with the other elements of the computing system, e.g., by entering commands and viewing responses. In this fashion, the user or operator is able to retrieve the well data and make it available for simulation of proppant effects in a network of fractures, proppant predictions, and visualizations of proppant effects within the fractures. For example, a visualization may be in an interactive form that enables the operator to enhance portions of the model and derive analytical results therefrom. The visual representation may depict spatial distributions of values and/or integrated values such as injected volumes, flow rates, fracture dimensions, and estimated permeabilities. In some contemplated embodiments, an analysis module further produces recommendations for real-time modifications to treatment plans that are underway. Alternatively, such analysis and modifications are implemented automatically, i.e., without human input.

Storage area network ("SAN") 208 provides low-latency access to shared storage devices 210. The SAN 208 may take the form of, e.g., a Fibrechannel or Infiniband network. Shared storage units 210 may be large, stand-alone information storage units that employ magnetic disk media for nonvolatile data storage. Other suitable forms of nontransitory information storage media can also be employed. To improve data access speed and reliability, the shared storage units 210 may be configured as a redundant disk array ("RAID").

The SAN 208 may store a measurement database including treatment program information such as a pumping schedule, flow rates, flow volumes, slurry concentrations, fluid compositions, injection locations, shut-in times, and the like. The measurement database may further include geological data relating to geological properties of a subterranean region. For example, the geological data may include information on wellbores, completions, or information on other attributes of the subterranean region. In some cases, the geological data includes information on the lithology, fluid content, stress profile (e.g., stress anisotropy, maximum and minimum horizontal stresses), pressure profile, spatial extent, natural fracture geometries, or other attributes of one or more rock formations in the subterranean zone. The geological data can include information collected from well logs, rock samples, outcroppings, microseismic imaging, tilt measurements, or other data sources.

The measurement database may still further include fluid data relating to well fluids, proppants, and entrained materials. The fluid data may identify types and sizes of proppants, fluids, fluid properties, thermodynamic conditions, and other information related to well assembly fluids. The fluid data can include flow models for compressible or incompressible fluid flow. For example, the fluid data can include coefficients for systems of governing equations (e.g., Navier-Stokes equations, advection-diffusion equations, continuity equations, etc.) that represent fluid flow generally or fluid flow under certain types of conditions. In some cases, the governing flow equations define a nonlinear system of equations. The fluid data can include data related to native fluids that naturally reside in a subterranean region, treatment fluids to be injected into the subterranean region, hydraulic fluids that operate well assembly tools, or other fluids that may or may not be related to a well assembly.

Workstation 204 may lack sufficient internal resources to perform such processing in a timely fashion for complex fracture networks. As such, the LAN 203 may further couple the workstation 204 to one or more multi-processor computers 206, which are in turn coupled via a SAN 208 to one or more shared storage units 210. LAN 203 provides high-speed communication between multi-processor computers 206 and with personal workstation 204. The LAN 204 may take the form of an Ethernet network.

Multi-processor computer(s) 206 provide parallel processing capability to enable suitably prompt processing of the measurements and fracture simulation information to simulate fracture fluid flows. Each computer 206 includes multiple processors 212, distributed memory 214, an internal bus 216, a SAN interface 218, and a LAN interface 220. Each processor 212 operates on allocated tasks to solve a portion of the overall problem and contribute to at least a portion of the overall results. Associated with each processor 212 is a distributed memory module 214 that stores application software and a working data set for the processor's use. Internal bus 216 provides inter-processor communication and communication to the SAN or LAN networks via the corresponding interfaces 218, 220. Communication between processors in different computers 206 can be provided by LAN 204 or via a mailbox mechanism on storage devices 210.

The processors 212 may locate and simulate the flow of fluids and proppants along hydraulically induced fractures by fracture mapping, spatial discretization (separating the formation into zones), equation construction, and equation solving using information from the measurement database. Such simulations may include time-dependent spatial distribution of fluid flow parameters or proppant effects such as proppant volume fraction, fluid viscosity, fluid density, proppant settling, and proppant bed heights. Before detailing generation of time-dependent spatial distributions, a discussion of discrete fracture networks will be helpful.

FIG. 3 shows a discrete fracture network 300 including a borehole 302 and fractures 304. The network 300 naturally partitions the hydrocarbon reservoir into multiple rock blocks 306. At the onset of treatment, the fractures 304 may be closed or open, the rock blocks 306 are at a structural equilibrium, and the fluids in the formation are at rest. The network 300 is stimulated, for example, by the injection of fracturing fluid, oftentimes containing multiple proppants, at one or more injection points. The injection points may correspond to perforation points on the borehole 302. Flow in a single fracture may be represented as:

$$\frac{\partial A\rho}{\partial t} + \frac{\partial m}{\partial x} + h_{fracture}\rho Q_L = \qquad(1)$$
$$\sum_{i=1}^{nproppants} -\rho_{pi}\phi_i v_{settlingi} w - \rho_f \phi_i v_{settlingi} w(1-\phi_{critical})/(\phi_{critical})$$

$$\frac{\partial m}{\partial t} + \frac{\partial m^2/(\rho A)}{\partial x} + AP_x + F = (\mu(m/\rho)_x)_x + \qquad(2)$$
$$\sum_{i=1}^{nproppants} -m/(\rho A)\phi_i v_{settlingi} w(\rho_{pi} + \rho_f(1-\phi_{critical})/(\phi_{critical}))$$

where, A is the area of the fracture cross-section area or aperture, m is the mass flow rate, $\mu$ is the fluid-proppant mixture viscosity coefficient, p is the pressure values along the fracture, t is time, x is the coordinate along the fracture axial direction, $\rho$ is the fluid-proppant mixture density, $\rho_f$ is the fluid density, $h_{fracture}$ is the fracture height, nproppants is the number of proppants in the fracture, $\rho_{pi}$ is the density of the $i^{th}$ proppant, w is the fracture width, $v_{settling}$ is the proppant settling velocity, $\phi_{critical}$ is the critical volume fraction of the proppant and $Q_L$ is the mass rate of the leak-off into the formation. The subscripts x and t indicate the derivative, while other subscripts, such as f and L, do not indicate the derivative.

In some pumping schedules and applications, proppant may be inserted in the fluid at several of the injection points and transported to the formation through the junctions and fractures. Several proppant transport models may be used within individual fractures depending on the application and the desired degree of physical accuracy. Alternatively, the same transport model may be used for all the proppants. The proppant transport may be represented as:

$$\frac{\partial A\phi}{\partial t} + \frac{\partial \phi m/\rho}{\partial x} = -\phi v_{settling} w \qquad(3a)$$

$$v_{settling}^2 = \frac{4}{3C_D} \frac{(\rho_p - \rho_f)g d_p}{\rho_f} e^{-5.9\phi} \qquad(3b)$$

where $\phi$ is the proppant volume fraction, $\rho_p$ is the proppant density, g is the gravitational constant, $C_D$ is the drag coefficient, $d_p$ is the proppant diameter. The effects of the proppant on the fluid properties in equation (2), such as the viscosity and the density, may be represented as:

$$\rho = \rho_{slurry1} C + \rho_{slurry2}(1-C) \qquad(4a-4d)$$
$$\mu = \mu_{slurry1} C + \mu_{slurry2}(1-C)$$
$$\rho_{slurry} = \rho_f\left(1 - \sum_{i=1}^{nproppants} \phi_i\right) + \sum_{i=1}^{nproppants} \rho_{pi}\phi_i$$
$$\mu_{slurry} = \mu_f e^{-k\sum_{i=1}^{nproppants}\phi_i}$$

where C is the marker concentration between two fluids, slurry 1 and slurry 2. The evolution of C may be estimated as follows:

$$\frac{\partial AC}{\partial t} + \frac{\partial Cm/\rho}{\partial x} = 0 \qquad(5)$$

The mass flow in junctions, i.e. locations where fractures intersect, may be represented as:

$$\frac{d(hA\phi)_{junction}}{dt} - \sum_{i=1}^{inlet\ fractures} h_i\mu_i\phi_i w_i + \qquad(6)$$
$$\left(v_{settling}(A)_{junction}\phi_{junction} + \sum_{i=1}^{outlet\ fractures} h_i\phi_i u_i w_i\right) = 0$$

subject to $$\phi_{out} = \phi_{junction} \qquad(7)$$

where the summation is over inlet and outlet fractures, $h_i$ is the $i^{th}$ propped fracture height, $u_i$ is the $i^{th}$ fracture velocity, $\phi_i$ is the $i^{th}$ fracture proppant volume fraction, $w_i$ is the $i^{th}$ fracture width and A is the cross-sectional area. This condition determines an area-weighted average scalar at the junction from the inflow streams, and distributes the scalar equally among the outflow streams. The scalars may be temperature, proppant volume fraction, etc.

The proppant bed height may be represented as:

$$\frac{dh}{dt} = \phi v_{settling}/\phi_{critical} \qquad(8)$$

The proppant bed is assumed to be stationary and each proppant forms a layer in the bed. Fracture bed height may be derived from the proppant bed heights by:

$$h_{fracture} = H - \sum_{i=1}^{nproppants} h_i \qquad(9)$$

Where H represents the total height of the fracture. The leak-off of fluids from the fractures 304 to neighboring rock blocks 306 (and vice-versa, also known as flow-back) take place along the fracture boundaries. The leak-off may be represented by:

$$Q_L = \sum_{i=1}^{nproppants} C_i \frac{(1-\phi_i)}{\mu_i \phi_i} \Delta P \qquad(10)$$

Where $C_i$ is defined as $$\frac{d_{pi}}{180},$$

$d_{pi}$ is the $i^{th}$ proppant diameter and P is the fracture Pressure. For example, for two proppants, the leak-off may be represented by:

$$Q_L = \left[C_1 \frac{(1-\phi_1)}{\mu_1\phi_1} + C_2 \frac{(1-\phi_2)}{\mu_2\phi_2}\right]\Delta P \qquad(11)$$

where $$C_1 = \frac{d_{p1}}{180} \text{ and } C_2 = \frac{d_{p2}}{180}.$$

Temperature effects on the flow may be represented by:

$$\frac{\partial AE}{\partial t} = -\frac{\partial\left(A\left(E+P-\frac{4}{3}\mu_f \frac{\partial u}{\partial x}\right)u\right)}{\partial x} + qH + \rho_f ug\sin\theta A \quad (12)$$

where $$E = \frac{1}{2}\frac{m^2}{\rho A^2} + U,$$

and U is the internal temperature of the surrounding earth, which increases linearly with depth. Q is the hat lass/gain to the formation defined below, $\mu_f$ is the fluid viscosity, and $\theta$ is the wellbore orientation with the horizontal.

Assuming that viscous dissipation is negligible, that gravity is normal to the flow velocity, that the effects of the pressure gradient are small, and that kinetic energy variation both spatially and temporally is negligible, equation (12) becomes:

$$\frac{\partial AE}{\partial t} = -\frac{\partial(A(Ev))}{\partial x} + qH \quad (13)$$

$$E = \rho c_p (T - T_o) \quad (14)$$

$$q = 2 * \left(\rho c_p \frac{Q_L}{A_{fracture}} + U_{to}\right)(T_{wall} - T) \quad (15)$$

Using equations (14) and (15) in equation (13):

$$\frac{\partial A\rho C_p T}{\partial t} = -\frac{\partial(Av\rho C_p T)}{\partial x} + 2 * \left(U_{to} + \frac{Q_L}{A_{fracture}}\rho C_p\right)(Twall - T)H \quad (16)$$

where $T_{wall}$ is estimated from the reservoir temperature, $U_{to}$ is the overall heat transfer coefficient, $C_P$ is the specific heat, H is the total fracture height, and T is the mixture temperature.

Returning to FIG. 2, the equations described above may be constructed and solved by the processors 212. For example the processors 212 may form a processing module that determines a current network state that includes flow parameter values at discrete points arranged one-dimensionally along the fractures in the network. Although fractures are three-dimensional objects having a length, height, and aperture, the flow parameters are simulated as uniform across the height and aperture of the fracture enabling each fracture to be treated as a one dimensional element. The fracture is divided into discrete points at which the flow parameters (flow rate, pressure, proppant concentration, diverter concentration, density, viscosity, and the like) are calculated. The differential equations that govern the simulated fluid flow exhibit improved numerical stability when the points at which the flow rate is calculated are offset or staggered from the remaining parameters.

The processing module may construct a set of linear equations for deriving a subsequent network state from the current state while accounting for layering of multiple types or sizes of proppants using equations (3a) and (3b) above. Similarly, the processing module may account for leak-off or flow-back through multiple proppant layers using equation (10) above.

Next, the processing module repeatedly solves the set of linear equations to obtain a sequence of subsequent network states embodied by time-dependent spatial distribution of at least one flow parameter or proppant effect such as proppant volume fraction, velocity, pressure, density, viscosity, marker concentration, temperature, fracture width, fracture height, proppant settling velocity, proppant distribution, proppant settling height, and the like. Subsequently, the processing module may output the time-dependent spatial distribution for display. For example, a monitor may display a temperature distribution of fluids of the subsequent network states, a proppant settling height distribution of the subsequent network states, or a marker concentration distribution of the subsequent network states. Generation and use of the time-dependent spatial distribution is described with respect to FIG. 4.

FIG. 4 is a flow diagram of an illustrative method 400 of fracturing flow simulation. At 402, a processor, such as the one or more processors described with respect to FIG. 2, identifies a discrete fracture network that partitions a reservoir into porous rock blocks. For example, the processor may obtain information from a data acquisition module or measurement database as discussed above to determine the characteristics of the discrete fracture network. The discrete fracture network may include multiple types or sizes of proppants and multiple fluids. For example, proppants may be between 1 nm and 1000 microns. Also, proppants may be of uncoated or resin coated type. Examples of proppants can include sand, gravel, glass beads, polymer beads, ground products from shells and seeds such as walnut hulls, man-made materials such as ceramic proppant, bauxite, tetrafluoroethylene materials (e.g., TEFLON polytetrafluoroethylene), fruit pit materials, processed wood, composite particulates prepared from a binder, and fine grade particulates such as silica, alumina, fumed silica, carbon black, graphite, mica, titanium dioxide, meta-silicate, calcium silicate, kaolin, talc, zirconia, boron, fly ash, formation cuttings (e.g., reinjected), hollow glass microspheres, and solid glass, or mixtures thereof. The discrete fracture network may also include junctions where fractures intersect.

At 404, the processor determines a current network state that includes flow parameter values at discrete points arranged one-dimensionally along the fractures in said network. For example, the processor may obtain information from a data acquisition module or measurement database as discussed above to determine the current state of a proppant volume fraction, velocity, pressure, density, viscosity, marker concentration, temperature, fracture width, fracture height, proppant settling velocity, proppant distribution, proppant settling height, and the like. Although fractures are three-dimensional objects having a length, height, and aperture, the flow parameters are simulated as uniform across the height and aperture of the fracture enabling each fracture to be treated as a one dimensional element.

At 406, the processor constructs a set of linear equations for deriving a subsequent network state from the current state. For example, The processor may construct the set of linear equations, as described above, for deriving the subsequent network state while accounting for proppant effects on fluid viscosity, fluid density, proppant settling, proppant bed heights, and the like. The processor may also construct the equations accounting for the layering of multiple types or sizes of proppants, leak-off through multiple proppant layers, flow-back through multiple proppant layers, and the like.

Figure 7:
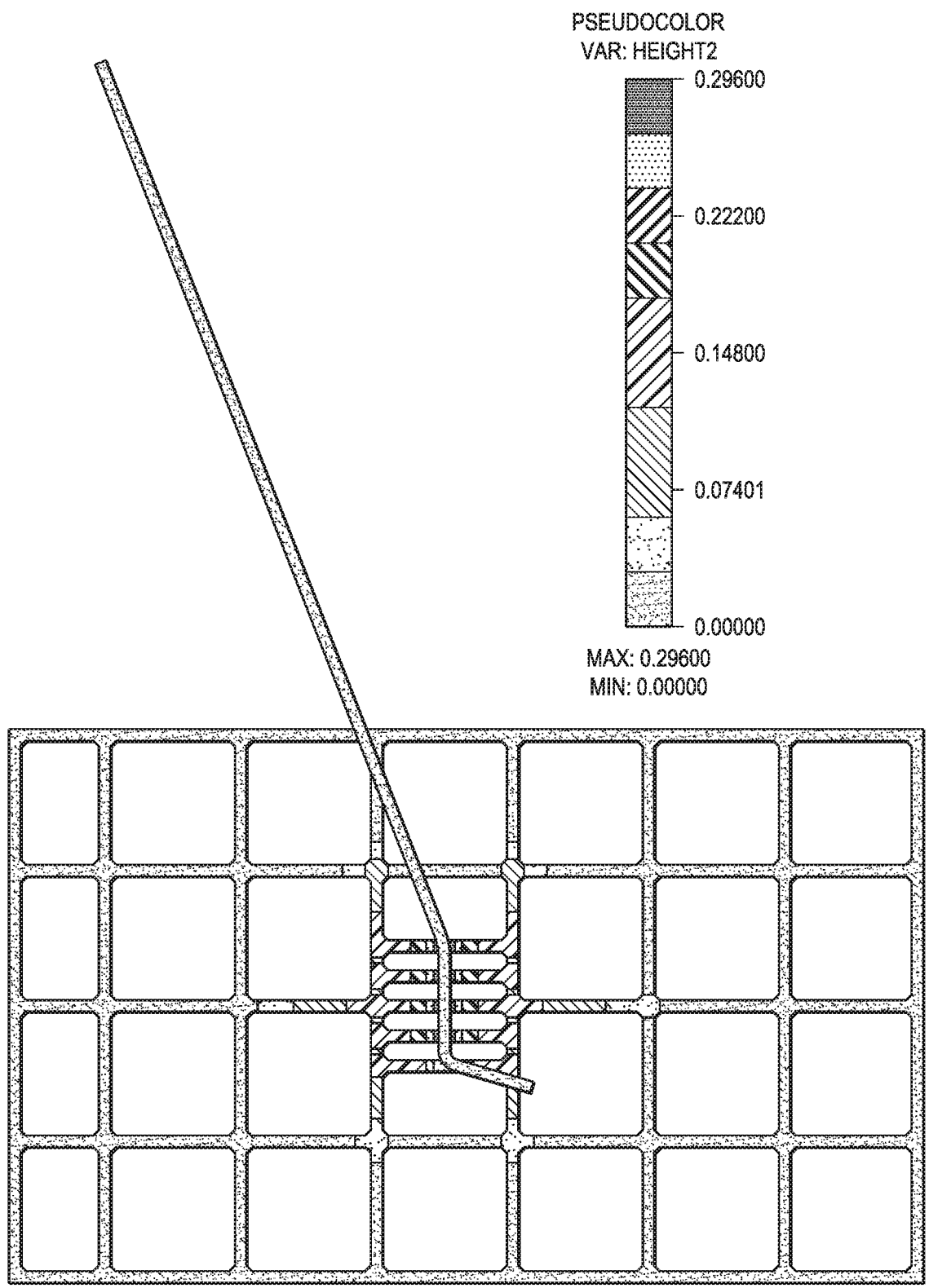

At 408, the processor repeatedly solves the set of linear equations to obtain a sequence of subsequent network states. For example, the equations may be solved implicitly using a linear solver based on Gaussian elimination. The sequence embodies a time-dependent spatial distribution of at least one flow parameter, and the flow parameter includes a proppant volume fraction, velocity, pressure, density, viscosity, marker concentration, temperature, fracture width, fracture height, proppant settling velocity, proppant distribution, or proppant settling height. FIG. 5-7 illustrate examples of time-dependent spatial distributions.

At 410, the processor outputs the time-dependent spatial distribution for display. Displaying the time-dependent spatial distribution may include displaying the flow parameter of the subsequent network states. For example proppant volume fraction, velocity, pressure, density, viscosity, marker concentration, temperature, fracture width, fracture height, proppant settling velocity, proppant distribution, and/or proppant settling height of the subsequent network states may be output for display as graphs, charts, tables, and the like.

At 412, the operator alters the fluid flow or fluid composition in the network of fractures based on the time-dependent spatial distribution. For example, the distribution is used as a prediction of the treatment operation outcome, enabling the treatment program to be evaluated and modified if necessary. In at least one embodiment, the alteration occurs automatically, i.e., without human input.

FIGS. 5-7 show multiple time-dependent spatial distributions for different parameters of the same fracture network. FIG. 5 shows an example of a time-dependent distribution illustrating temperature throughout the fracture network. The fluid is cooled or heated due to heat transfer with the formation depending upon the temperature difference between the fluid and the formation. FIG. 6 shows an example of a time-dependent distribution illustrating bed height of a first proppant throughout the fracture network. The proppant bed height is higher closer to the near wellbore region due to high settling rates and volume fraction. The bed height decreases further away from the near wellbore region. FIG. 7 shows an example of a time-dependent distribution illustrating bed height of a second proppant throughout the fracture network. The second proppant follows the same trends as the first proppant for the bed height.

In at least one embodiment, a hydraulic fracturing flow simulation method includes identifying a discrete fracture network that partitions a reservoir into porous rock blocks. The method further includes determining a current network state that includes flow parameter values at discrete points arranged one-dimensionally along the fractures in said network. The method further includes constructing a set of linear equations for deriving a subsequent network state from the current state. The method further includes repeatedly solving the set of linear equations to obtain a sequence of subsequent network states, the sequence embodying a time-dependent spatial distribution of at least one flow parameter, said flow parameter comprising a proppant volume fraction. The method further includes displaying the time-dependent spatial distribution.

In another embodiment. a hydraulic fracturing flow system includes a data acquisition module that identifies a discrete fracture network that partitions a reservoir into porous rock blocks. The system further includes a processing module that determines a current network state that includes flow parameter values at discrete points arranged one-dimensionally along the fractures in said network. The processing module constructs a set of linear equations for deriving a subsequent network state from the current state. The processing module repeatedly solves the set of linear equations to obtain a sequence of subsequent network states, the sequence embodying a time-dependent spatial distribution of at least one flow parameter, said flow parameter comprising a proppant volume fraction. The processing module displays the time-dependent spatial distribution.

The following features may be incorporated into the various embodiments described above, such features incorporated either individually in or conjunction with one or more of the other features. Constructing the set may include constructing the set of linear equations for deriving the subsequent network state from the current state while accounting for proppant effects on fluid viscosity, fluid density, proppant settling, and proppant bed heights. The discrete fracture network may include multiple types or sizes of proppants and multiple fluids. Constructing the set may include constructing the set of linear equations for deriving the subsequent network state from the current state while accounting for layering of multiple types or sizes of proppants. Constructing the set may include constructing the set of linear equations for deriving the subsequent network state from the current state while accounting for leak-off through multiple proppant layers. Constructing the set may include constructing the set of linear equations for deriving the subsequent network state from the current state while accounting for flow-back through multiple proppant layers. The discrete fracture network may include junctions where fractures intersect, and wherein the equations account for proppant settling and bed heights at each junction. The flow parameter may include velocity, pressure, density, viscosity, marker concentration, temperature, fracture width, fracture height, proppant settling velocity, proppant distribution, and proppant settling height. Displaying the time-dependent spatial distribution may include displaying temperature distribution of fluids of the subsequent network states. Displaying the time-dependent spatial distribution may include displaying proppant settling height distribution of the subsequent network states. Displaying the time-dependent spatial distribution may include displaying marker concentration distribution of the subsequent network states. The discrete fracture network may include multiple types or sizes of proppants and multiple fluids. The processing module may construct the set of linear equations for deriving the subsequent network state from the current state while accounting for layering of multiple types or sizes of proppants. The processing module may construct the set of linear equations for deriving the subsequent network state from the current state while accounting for leak-off through multiple proppant layers. The processing module may construct the set of linear equations for deriving the subsequent network state from the current state while accounting for flow-back through multiple proppant layers. The flow parameter may include velocity, pressure, density, viscosity, marker concentration, temperature, fracture width, fracture height, proppant settling velocity, proppant distribution, and proppant settling height. The processing module may display a temperature distribution of fluids of the subsequent network states. The processing module may display a proppant settling height distribution of the subsequent network states. The processing module may display a marker concentration distribution of the subsequent network states.

While the present disclosure has been described with respect to a limited number of embodiments, those skilled in the art will appreciate numerous modifications and variations therefrom. It is intended that the appended claims cover all such modifications and variations.

What is claimed is:

1. A hydraulic fracturing flow simulation method comprising:
   identifying a discrete fracture network a priori that partitions a reservoir into porous rock blocks;
   injecting hydraulic fracturing fluid into the discrete fracture network;
   determining a current network state, wherein each fracture of the identified fracture network is treated as a one dimensional element having uniform height and aperture with discrete points at which flow parameters are simulated;
   constructing a set of linear equations for deriving a subsequent network state from the current state;
   repeatedly solving the set of linear equations to obtain a sequence of subsequent network states, the sequence embodying a time-dependent spatial distribution of at least one of the flow parameters, the at least one flow parameter comprising a proppant volume fraction;
   displaying the time-dependent spatial distribution; and
   altering a fluid flow or fluid composition of the hydraulic fracturing fluid in the discrete fracture network based on the time-dependent spatial distribution of the at least one flow parameter.

2. The method of claim 1, wherein constructing the set comprises constructing the set of linear equations for deriving the subsequent network state from the current state while accounting for proppant effects on fluid viscosity, fluid density, proppant settling, and proppant bed heights.

3. The method of claim 1, wherein the discrete fracture network includes multiple types or sizes of proppants and multiple fluids.

4. The method of claim 1, wherein constructing the set comprises constructing the set of linear equations for deriving the subsequent network state from the current state while accounting for layering of multiple types or sizes of proppants.

5. The method of claim 1, wherein constructing the set comprises constructing the set of linear equations for deriving the subsequent network state from the current state while accounting for leak-off through multiple proppant layers.

6. The method of claim 1, wherein constructing the set comprises constructing the set of linear equations for deriving the subsequent network state from the current state while accounting for flow-back through multiple proppant layers.

7. The method of claim 1, wherein the discrete fracture network includes junctions where fractures intersect, and wherein the linear equations account for proppant settling and bed heights at each junction.

8. The method of claim 1, wherein the flow parameter is selected from the group consisting of velocity, pressure, density, viscosity, marker concentration, temperature, fracture width, fracture height, proppant settling velocity, proppant distribution, and proppant settling height.

9. The method of claim 1, wherein displaying the time-dependent spatial distribution comprises displaying temperature distribution of fluids of the subsequent network states.

10. The method of claim 1, wherein displaying the time-dependent spatial distribution comprises displaying proppant settling height distribution of the subsequent network states.

11. The method of claim 1, wherein displaying the time-dependent spatial distribution comprises displaying marker concentration distribution of the subsequent network states.

12. A hydraulic fracturing flow system comprising:
   a data acquisition module that identifies a discrete fracture network a priori that partitions a reservoir into porous rock blocks;
   an injection system that operates to inject hydraulic fracturing fluid into the discrete fracture network; and
   a processing module that:
      determines a current network state, wherein each fracture of the discrete fracture network is treated as a one dimensional element having uniform height and aperture with discrete points at which flow parameters are simulated;
      constructs a set of linear equations for deriving a subsequent network state from the current state;
      repeatedly solves the set of linear equations to obtain a sequence of subsequent network states, the sequence embodying a time-dependent spatial distribution of at least one of the flow parameters, the at least one flow parameter comprising a proppant volume fraction; and
      displays the time-dependent spatial distribution, wherein the injection system alters a fluid flow or fluid composition of the hydraulic fracturing fluid in the discrete fracture network based on the time-dependent spatial distribution of the at least one flow parameter.

13. The system of claim 12, wherein the discrete fracture network includes multiple types or sizes of proppants and multiple fluids.

14. The system of claim 12, wherein the processing module constructs the set of linear equations for deriving the subsequent network state from the current state while accounting for layering of multiple types or sizes of proppants.

15. The system of claim 12, wherein the processing module constructs the set of linear equations for deriving the subsequent network state from the current state while accounting for leak-off through multiple proppant layers.

16. The system of claim 12, wherein the processing module constructs the set of linear equations for deriving the subsequent network state from the current state while accounting for flow-back through multiple proppant layers.

17. The system of claim 12, wherein the flow parameter is selected from the group consisting of velocity, pressure, density, viscosity, marker concentration, temperature, fracture width, fracture height, proppant settling velocity, proppant distribution, and proppant settling height.

18. The system of claim 12, wherein the processing module displays a temperature distribution of fluids of the subsequent network states.

19. The system of claim 12, wherein the processing module displays a proppant settling height distribution of the subsequent network states.

20. The system of claim 12, wherein the processing module displays a marker concentration distribution of the subsequent network states.

* * * * *